United States Patent
Wurzel et al.

(10) Patent No.: US 7,633,015 B2
(45) Date of Patent: Dec. 15, 2009

(54) CONFORMING, ELECTRO-MAGNETIC INTERFERENCE REDUCING COVER FOR CIRCUIT COMPONENTS

(75) Inventors: Josh Wurzel, Sunnyvale, CA (US); Shawn Robert Gettemy, San Jose, CA (US); Ahmad Al-Dahle, Santa Clara, CA (US); Carlin James Vieri, Redwood City, CA (US); Wei Yao, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/214,682

(22) Filed: Jun. 19, 2008

(65) Prior Publication Data

US 2009/0244878 A1 Oct. 1, 2009

Related U.S. Application Data

(60) Provisional application No. 61/072,640, filed on Mar. 31, 2008.

(51) Int. Cl.
*H05K 1/16* (2006.01)

(52) U.S. Cl. ........................ 174/260; 361/760

(58) Field of Classification Search ............... 174/260; 361/760; 257/723, 724, 787
See application file for complete search history.

(56) References Cited

U.S. PATENT DOCUMENTS

| | | | |
|---|---|---|---|
| 5,600,181 A * | 2/1997 | Scott et al. ................... 257/723 |
| 6,400,574 B1 * | 6/2002 | Stephenson et al. .......... 361/760 |
| 7,292,459 B2 * | 11/2007 | Wang ............................ 361/818 |
| 7,426,117 B2 * | 9/2008 | Van Schuylenbergh et al. .. 361/760 |
| 2002/0111016 A1 * | 8/2002 | Farquhar et al. ............. 438/637 |
| 2004/0262749 A1 * | 12/2004 | Matayabas et al. ........... 257/734 |
| 2006/0272857 A1 * | 12/2006 | Arnold ........................ 174/377 |

* cited by examiner

*Primary Examiner*—Dean A. Reichard
*Assistant Examiner*—Andargie M Aychillhum
(74) *Attorney, Agent, or Firm*—Ropes & Gray LLP; Robert R. Jackson

(57) ABSTRACT

An electronic circuit component is provided with shielding for electro-magnetic interference ("EMI") by covering at least part of the component with a layer of electrical insulation that conforms to the shape of the surface to which the insulation is applied. At least part of the surface of the insulation is then covered by a layer of EMI shielding that conforms to the shape of the surface of the insulation to which the shielding is applied.

5 Claims, 10 Drawing Sheets

US 7,633,015 B2

CONFORMING, ELECTRO-MAGNETIC INTERFERENCE REDUCING COVER FOR CIRCUIT COMPONENTS

This application claims the benefit of U.S. provisional patent application 61/072,640, filed Mar. 31, 2008, which is hereby incorporated by reference herein.

BACKGROUND OF THE INVENTION

This invention relates to electronic circuitry, and more particularly to shielding that may be used around such circuitry to reduce electro-magnetic radiation from or to such circuitry (so-called electro-magnetic interference or EMI).

A traditional way to reduce EMI for electronic circuitry is to place electrically conducting (typically metal) shielding around the circuitry, which shielding is connected to electrical ground (i.e., a source of electrical ground potential or voltage). For example, several electronic circuit components that have been mounted on a printed circuit board ("PCB") may be placed under a metal cover or inside a metal container ("can"). A layer of electrical insulation may be included between the circuit components and this metal shielding to ensure that the shielding cannot cause any short circuits in the electronic circuitry by making electrical contact with that circuitry.

A possible problem with the foregoing approach is that the metal shielding is typically fabricated in advance with a predetermined size and shape, which size and shape the shielding retains after the shielding has been combined with the electronic circuitry to be shielded. This means that because of manufacturing tolerances for (1) the electronic circuitry, (2) the shielding, and (3) any insulation used between the circuitry and the shielding, the shielding must be made significantly larger than the theoretical minimum size the shielding could have. Such results are inconsistent with the need to make many types of electronic devices as small as possible.

SUMMARY OF THE INVENTION

In accordance with certain possible aspects of this invention, an electronic component may be shielded by at least partly covering it with a layer of electrical insulation that conforms to the shape of the surface of the electronic component to which the insulation is applied. The electrical insulation is then at least partly covered by a layer of EMI shielding that conforms to the shape of the surface of the insulation to which the EMI shielding is applied.

Further features of the invention, its nature and various advantages, will be more apparent from the accompanying drawings and the following detailed description.

DETAILED DESCRIPTION

Figure 1:
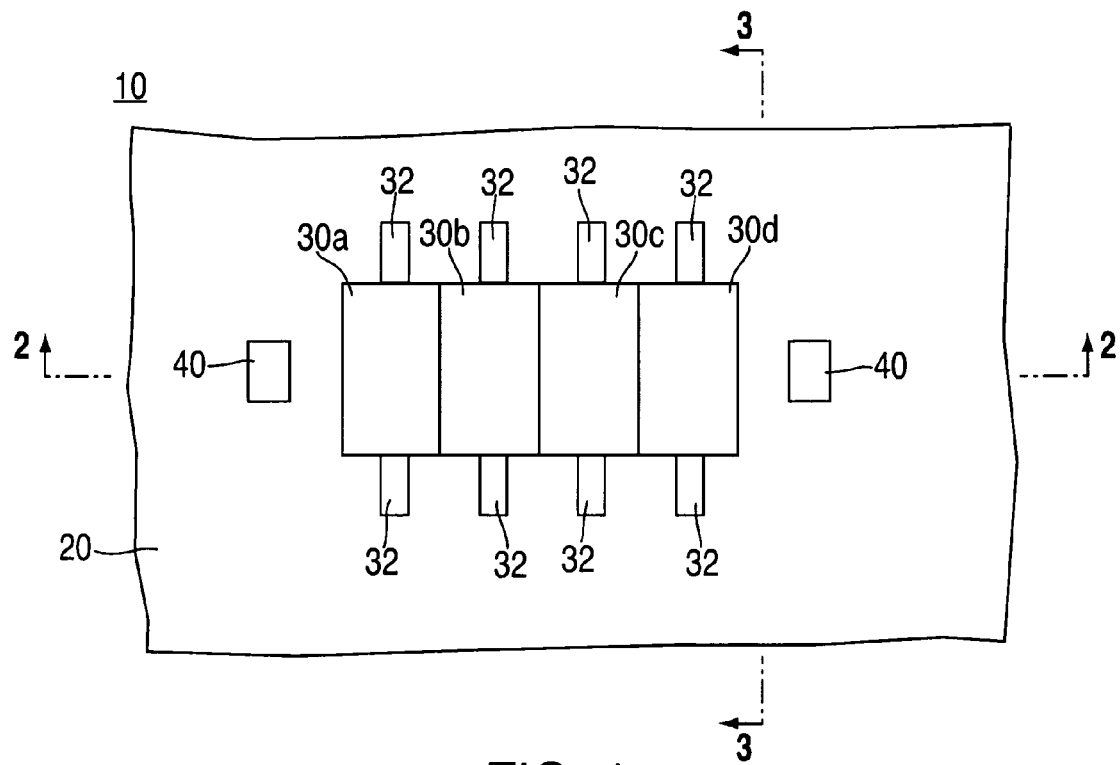
FIG. 1 is a simplified plan view of some illustrative prior art electronic circuitry.

Illustrative prior art electronic circuitry 10 is shown in FIG. 1 by way of additional background. Circuitry 10 includes a sheet 20 of printed circuit board ("PCB") material on which several electronic circuit components 30a-d are mounted. (As used herein, the term PCB includes all forms of this general type of element, such as flexible printed circuit, "flex", or "FPC" material.) Each of components 30 is shown as having two electrically conductive leads 32 extending from it. This is only an example, and a component can have any number of such leads. Moreover, these leads can have any of a variety of shapes, as well as any of a variety of locations relative to the remainder of the associated component 30. In the particular example shown in FIG. 1, leads 32 are shown as being intended for soldering to the upper surface of PCB 20 (e.g., to solder paste areas on that surface (see also later-described FIG. 3)). FIG. 1 also shows electrical ground contacts 40 on the upper surface of PCB 20. FIG. 1 shows circuitry 10 before any solder or any EMI shielding structure has been added to it.

Figure 2:
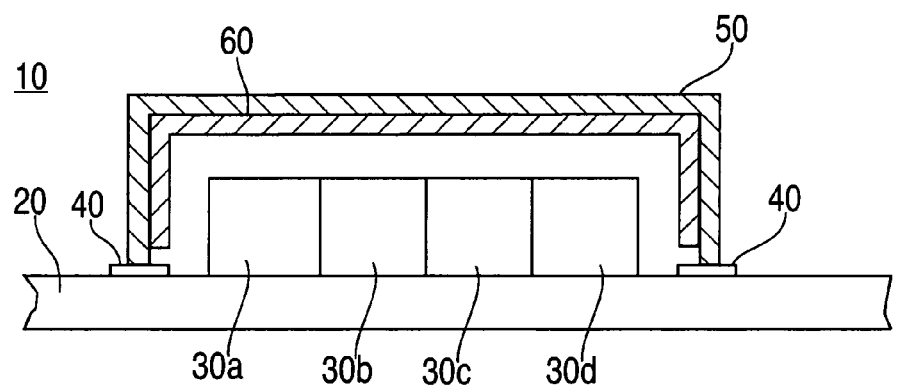
FIG. 2 is a simplified elevational view (partly in section along a line like 2-2 in FIG. 1) of circuitry like that shown in FIG. 1 with other conventional elements added.

FIG. 2 shows a structure like that shown in FIG. 1 from a line approximately like that indicated at 2-2 in FIG. 1. However, FIG. 2 shows the structure after addition of EMI shielding 50 of a prior art kind. FIG. 2 shows this shielding 50 and some associated electrical insulation 60 in section (taken along a line like 2-2 in FIG. 1), but FIG. 2 is otherwise primarily an elevational view.

FIG. 2 shows the placement of a metal cover 50 over components 30 and a portion of PCB 20. To ensure that metal cover 50 cannot cause a short circuit in the circuitry that it covers, a layer of electrical insulation 60 is provided between cover 50 and the underlying circuitry 30, etc. Cover 50 is electrically connected to ground contacts 40 on PCB 20. For example, cover 50 may be soldered to these ground contacts. Accordingly, cover 50 provides EMI shielding for the electronic circuit components 30 under or inside that cover.

Figure 3:
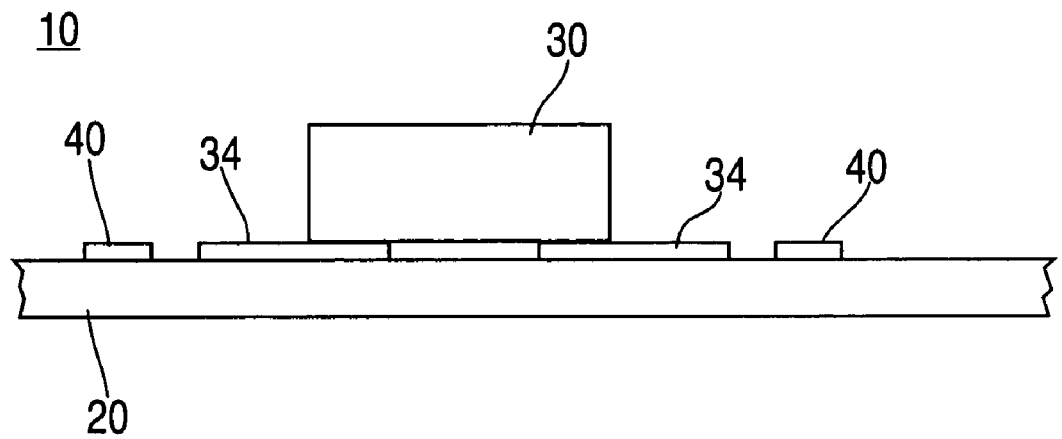
FIG. 3 is a simplified elevational view taken along a line like 3-3 in FIG. 1, but with some possible additional features shown.

FIG. 3 shows a structure like that shown in FIG. 1, but from another direction (i.e., along the line 3-3 in FIG. 1). FIG. 3 shows a typical electronic circuit component 30 on solder paste regions 34 prior to soldering of component 30 to PCB 20 (i.e., prior to so-called reflow). FIG. 3 shows additional ground contacts 40 beyond paste regions 34.

Figure 4:
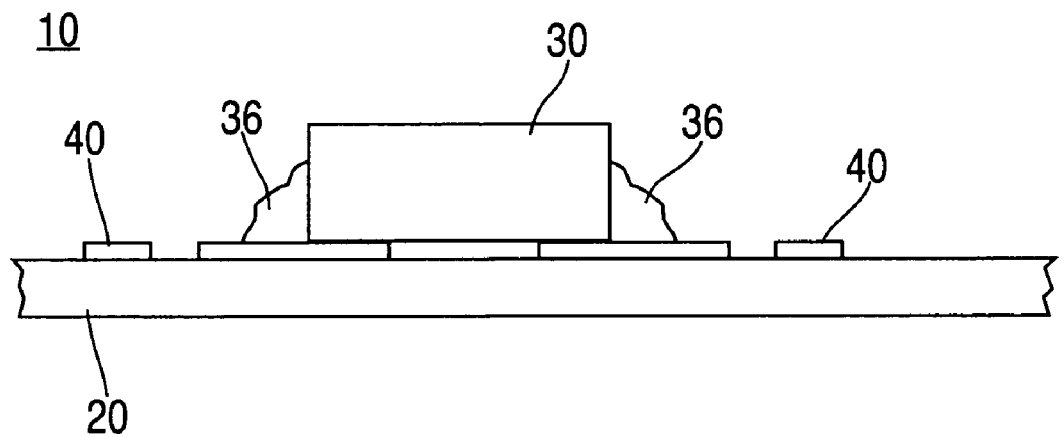
FIG. 4 is similar to FIG. 3, but shows a later stage in processing what is shown in FIG. 3.

FIG. 4 shows the FIG. 3 structure again, but after reflow. As shown in FIG. 4, solder areas 36 now exist at the location of each solder paste region 34 in FIG. 3. Like FIG. 1, FIGS. 3 and 4 show the structure before any EMI shielding structure has been added.

Figure 5:
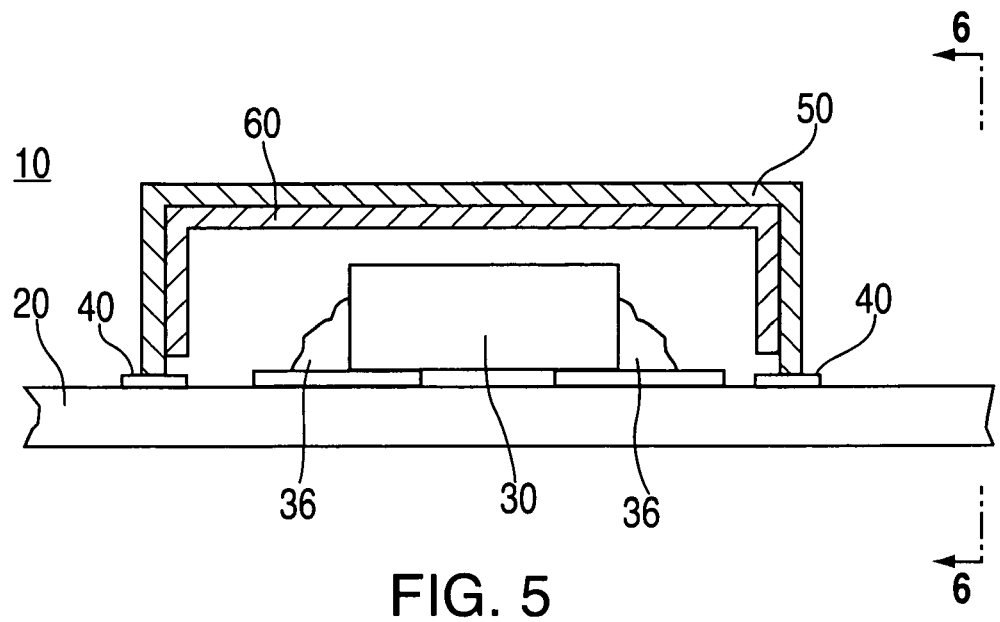
FIG. 5 is again similar to FIG. 4, but shows a still later stage in processing what is shown in FIG. 4.
Figure 6:
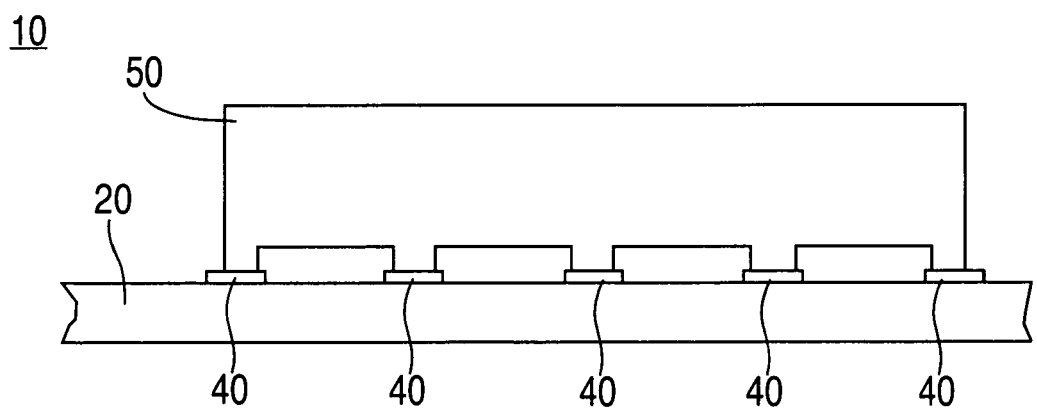
FIG. 6 is a simplified elevational view taken along the line 6-6 in FIG. 5.

FIG. 5 shows the FIG. 4 structure after addition of conventional insulation 60 and EMI shielding 50 of the type shown in FIG. 2. FIG. 6 shows how the lower edge of EMI shielding 50 may be scalloped or crenellated so that it can contact a plurality of spaced ground contacts 40, while jumping over other circuitry (e.g., electrical circuit traces on PCB 20) between those contacts 40.

Note that in the prior art construction that is illustrated by FIGS. 2 and 5, EMI shielding 50 has a predetermined size and shape that is basically independent of the size and shape of the circuit components 30 covered by that shielding. Moreover, shielding 50 holds that predetermined size and shape after it has been applied over components 30 and their ancillary electrical features like 32 and 36. Note also that shielding 50 is typically manufactured separately from the elements over which it is applied, and then this prefabricated shielding structure is added over the underlying electrical circuitry.

Because of tolerances required in manufacturing components 30 and related features 32 and 36, as well as tolerances required in separately manufacturing shielding 50 (and possibly also insulation 60), shielding 50 must be made so that (at a minimum) its interior is larger than (at a maximum) the exterior of the underlying circuitry. This typically means that shielding 50 effectively increases the size of the finished structure by a significant amount (as compared to the size of the underlying circuitry (e.g., 30, 32, and 36)). This may be undesirable in contexts in which an objective is to keep electronic circuit structures as small as possible.

Figure 7:
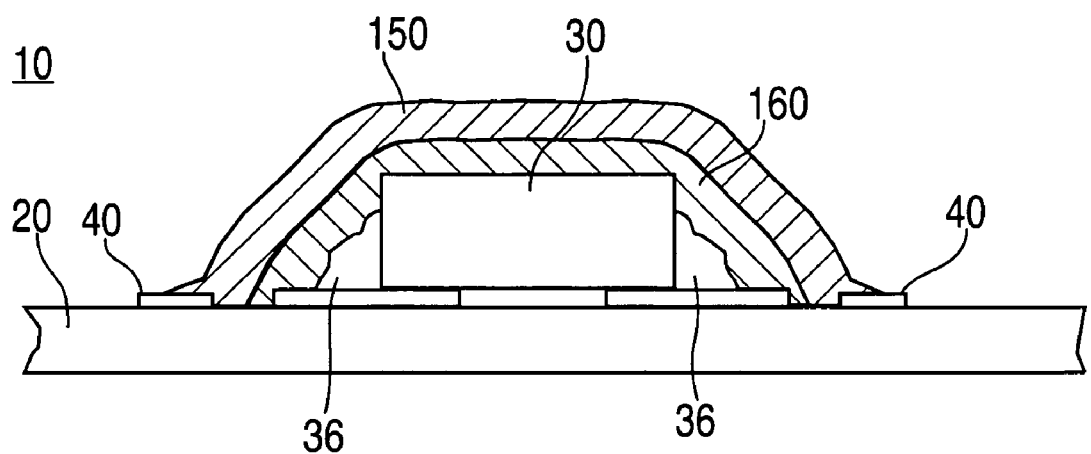
FIG. 7 is a simplified elevational view, partly in section, of an illustrative embodiment of apparatus in accordance with the present invention.

FIG. 7 shows an illustrative embodiment of how electronic circuitry components 30, mounted on a PCB 20 as shown in FIGS. like 1, 3, and 4, may be shielded more compactly than in prior art such as FIGS. 2, 5, and 6. In particular, FIG. 7 shows a starting structure like that shown in FIG. 4. Then a layer of conforming electrical insulation 160 is applied over the FIG. 4 structure except for ground contacts 40. Thereafter, a layer of conforming, electrically conducting, EMI shielding 150 is applied over insulation 160 so that the EMI shielding reaches and makes contact with ground contacts 40.

The term "conforming" as used herein with reference to insulation 160 and EMI shielding 150 means that each of these layers follows, contacts, and preferably also adheres to the surface to which it is applied. For example, insulation 160 lays down on and intimately and extensively contacts the surface(s) of elements 30, 36, etc., to which it is applied. Insulation 160 also preferably adheres to those surfaces. Insulation 160 is preferably applied with enough thickness to ensure good electrical insulation to elements 30, 36, etc., but also preferably not with greatly more thickness than is sufficient for that purpose. Insulation 160 can be applied in a liquid or at least a flowable fluid state. For example, insulation 160 can be an epoxy resin (e.g., a potting compound) or a polymer (e.g., silicone rubber) that is brushed on over elements 30, 36, etc., or otherwise flowed on over those elements while in a liquid or at least flowable state. After insulation 160 has been applied, it is converted to a non-fluid, non-flowable state. For example, resin or polymer insulation 160 may be cured (e.g., by time, temperature, and/or a chemical atmosphere) to render it non-fluid and therefore non-flowable. Such curing may make insulating layer 160 hard, or it may still remain somewhat flexible.

As another example of how conforming insulation 160 may be applied, shrink-wrap type materials and procedures may be used for that purpose. Thus, for example, a sheet of shrink-wrappable insulating material may be placed over elements 30, 36, etc. Then that material may be subjected to the conditions that cause it to shrink-wrap down into much more complete, conforming contact with the surfaces of the elements 30, 36, etc., over which it has been placed. For example, these conditions may be heat, a chemical environment, or anything else that activates the shrink-wrap properties of material 160. This causes insulation 160 to become conforming with (and also preferably to adhere to) the surfaces of elements 30, 36, etc., that it has been placed over. Such activation of the shrink-wrap properties of material 160 is a form of curing of that material, and it is embraced within the term curing (or the like) as that term is used herein.

After application of insulating layer 160 has been completed, EMI shielding layer 150 is applied over the insulation in a generally similar way. Thus shielding layer 150 is again a layer that conforms to the surfaces to which it is applied (in this case the exposed surface of insulation 160, ground contacts 40, etc.). Shielding layer 150 is again applied with sufficient thickness to enable it to perform its EMI shielding function, but preferably not with greatly more thickness than that. As a conforming layer, shielding layer 150 again follows and contacts (and also preferably adheres to) the surfaces to which it is applied. Application techniques like those described above for layer 160 may be used again for layer 150 (employing, of course, an electrically conducting material rather than an electrically insulating material). Thus, for example, an epoxy or polymer material that is loaded with metal particles may be deposited on the surfaces below in a liquid or at least a flowable fluid state. This may be done by brushing or otherwise flowing this material (150) on over the surfaces below. Then material 150 is converted to a non-fluid, non-flowable state. For example, the material of layer 150 may be cured (which may leave it hard or still flexible to some degree) as described above for layer 160. As another example, material 150 may be a shrink-wrappable sheet material. Such a sheet is placed over the surfaces to be shielded, and then the shrink-wrap properties of the material may be activated to cause it to conform to (i.e., to contact, follow, and preferably adhere to) all portions of the surfaces to which it has been applied.

FIG. 7 of course shows the conforming nature of each of layers 160 and 150 in the finished structure 10. Thus insulating layer 160 follows, contacts, and preferably adheres to all portions of the surfaces below it (e.g., the upper surfaces of elements 30, 36, etc.). Similarly, EMI shielding layer 150 follows, contacts, and preferably adheres to all portions of the surfaces below it (e.g., the upper surfaces of elements 160, 40, etc.). Especially of note is the fact that layer 150 makes good electrical contact with ground contacts 40 and provides an electrically continuous, electrically conductive cover over all elements below it. Layer 150 therefore provides EMI shielding for the circuitry covered by it.

Because elements 160 and 150 conform to the size and shape of the elements 30, 36, etc., that they cover, the resulting product (e.g., as in FIG. 7) can be smaller than prior art structures like FIGS. 2 and 5. The final product can have nearly the same size and shape as the underlying electronic circuitry, increased only by the thickness of layers 160 and 150.

Figure 8:
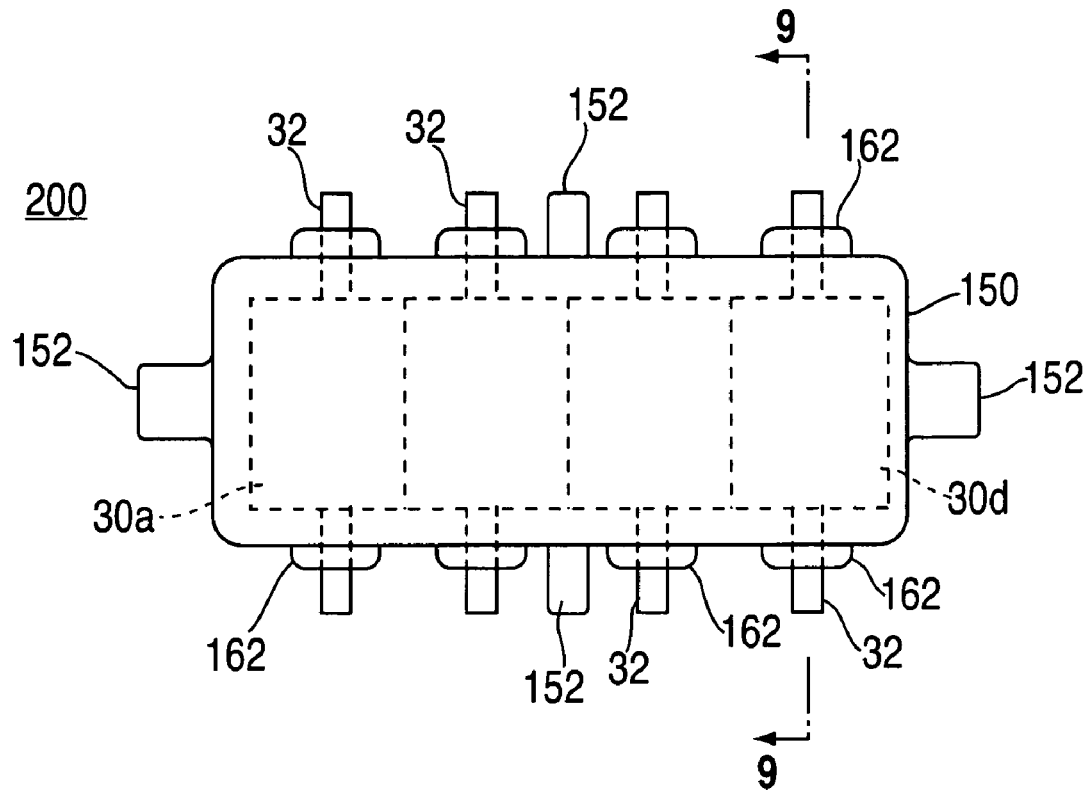
FIG. 8 is a simplified plan view of another illustrative embodiment of apparatus in accordance with the invention.
Figure 9:
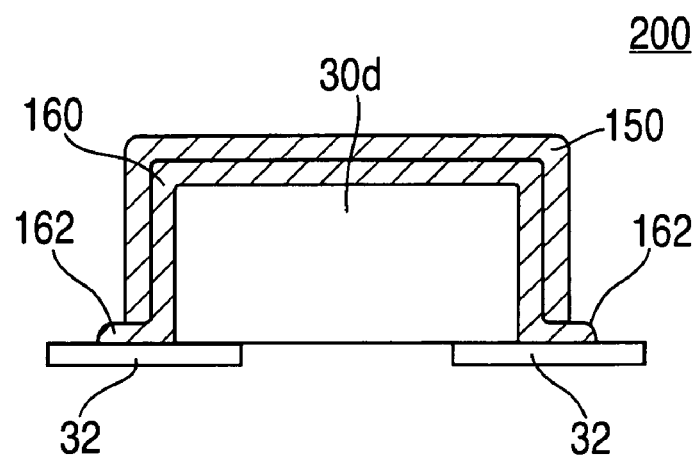
FIG. 9 is a simplified sectional view taken along the line 9-9 in FIG. 8.
Figure 10:
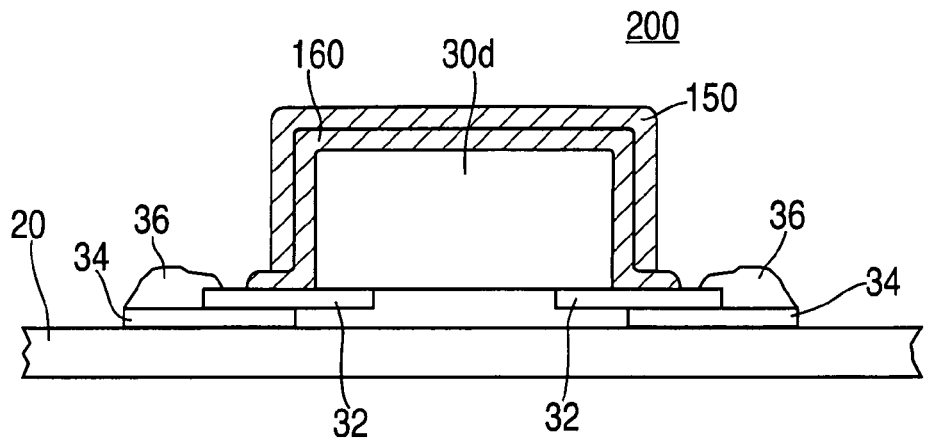
FIG. 10 is a view similar to FIG. 9 showing an illustrative embodiment of a later stage in use of the apparatus of FIGS. 8 and 9 in accordance with the invention.

FIGS. 8-10 illustrate an alternative embodiment of the invention in which one or more electronic circuit components are pre-shielded using the invention prior to being mounted on a substrate such as a PCB. Thus FIGS. 8 and 9 show elements 30a-d assembled side-by-side, and covered with conforming insulation 160 and conforming EMI shielding 150 before being mounted on a PCB. FIG. 10 then shows the assembly 200 of FIGS. 8 and 9 (which assembly 200 may be referred to as a pre-shielded custom component pack) mounted on PCB 20. These FIGS. will now be described in more detail.

In FIGS. 8 and 9, four electronic circuit components 30a-d (which can be like the similarly numbered elements in FIG. 1) are assembled side-by-side, with their leads 32 projecting from opposite sides of the assembly. A layer of conforming insulation 160 is then applied over the above-mentioned assembly (except for the outer-most portions of leads 32 and the underside of the assembly). Note that insulation 160 preferably does cover the inner-most portion of leads 32 as at 162 (but, again, not any portion of the lower surface of those leads). After insulation 160 has been applied (and cured, if necessary), a layer of conforming EMI shielding 150 is applied over most of insulation 160. Note that the insulation 162 on the inner portions of leads 32 prevents shielding 150 from making electrical contact with leads 32. Note also that shielding 150 is caused or allowed to form outward extensions 152 that can be used to reach ground contacts when assembly 200 is later mounted on a substructure such as a PCB. After shielding 150 has been applied, it is cured if necessary. Assembly 200 is now complete and ready for mounting on a substructure such as a PCB at any time. Such mounting is illustrated by FIG. 10, which will now be described.

Figure 11:
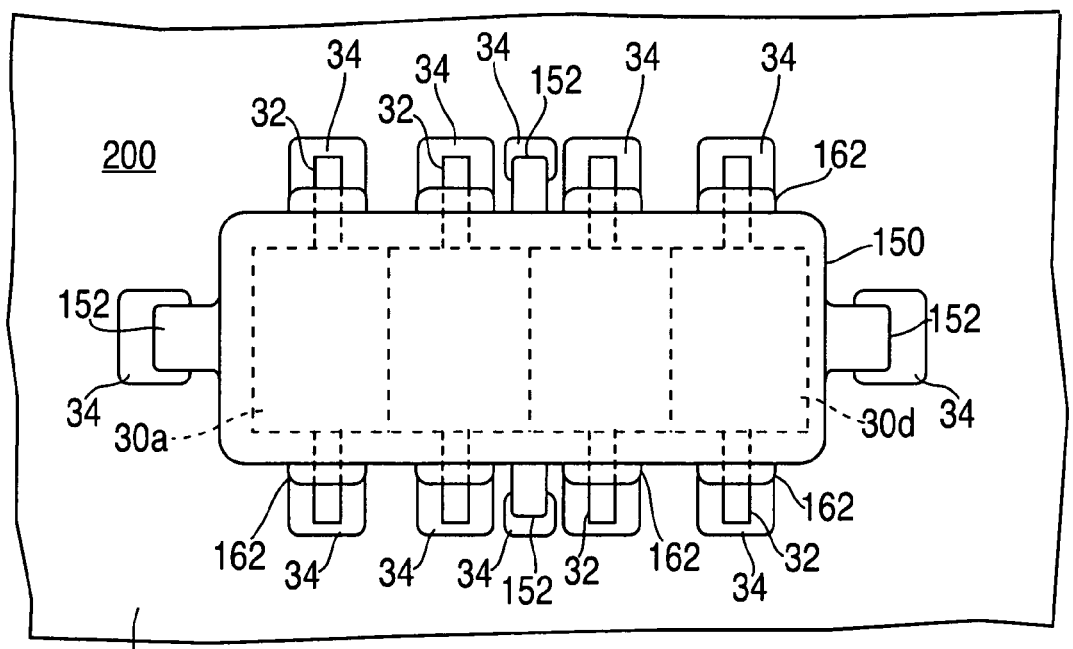
FIG. 11 is a simplified plan view showing an illustrative embodiment of an intermediate stage in use of the apparatus of FIGS. 8 and 9 in accordance with the invention.

FIG. 10 shows assembly 200 from FIGS. 8 and 9 mounted on PCB 20. A solder paste area 34 is disposed on PCB 20 where each contact 32 will come down on the PCB. Solder 36 is then applied to permanently electrically and mechanically connect the exposed outer end portion of each lead 32 to electrical circuitry on the PCB. The same is done to connect each of shielding tabs 152 to a ground contact on the PCB. See also FIG. 11, which shows a plan view of what is shown in FIG. 10 prior to the addition of solder 36. Thus FIG. 11 shows that there is a solder paste area 34 under each of leads 32, and also under each of EMI shielding extensions 152. Solder 36 (e.g., as in FIG. 10) is added over each of these solder paste areas 34 to connect the associated feature 32 or 152 of assembly 200 to circuitry on PCB 20.

Figure 12:
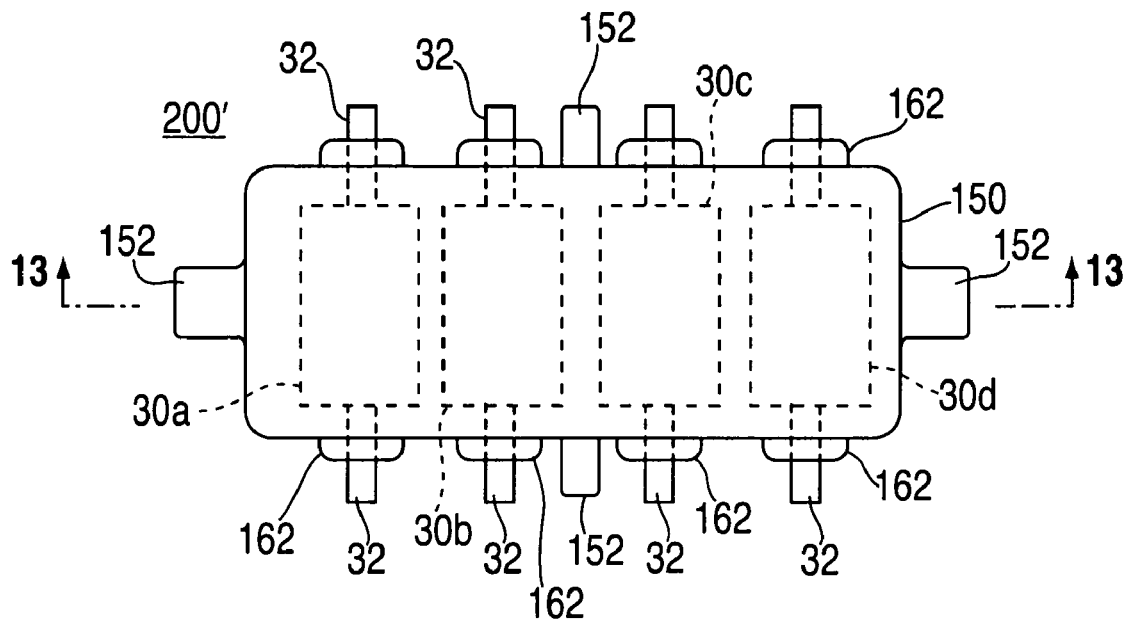
FIG. 12 is a view similar to FIG. 8 for another illustrative embodiment in accordance with the invention.
Figure 13:
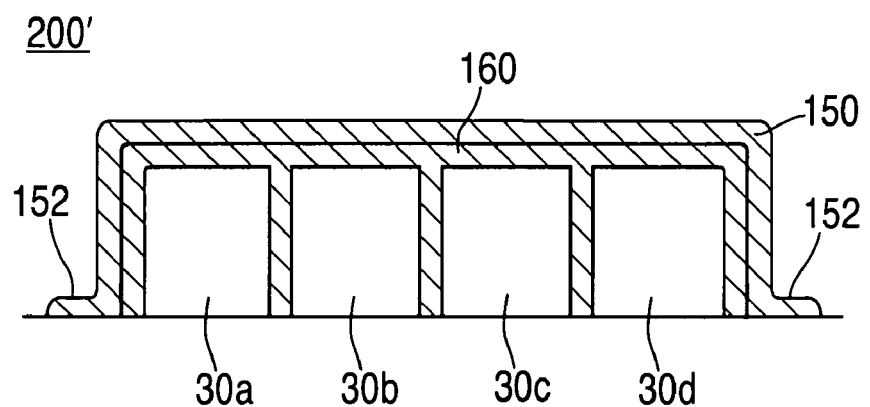
FIG. 13 is a simplified sectional view taken along the line 13-13 in FIG. 12.

FIGS. 12 and 13 show an alternative embodiment in which there is some spacing between electronic circuit components 30a-d in pre-shielded custom component pack 200'. In this embodiment the spacing between components 30 is filled by conforming insulation material 160. In all other respects assembly 200' may be similar to assembly 200.

Any of the materials mentioned earlier for insulation 160 can be used again for the insulation 160 in embodiments like those illustrated by FIGS. 8-13. Also, the above-described techniques for applying (and, if necessary, curing) insulation 160 can be used again for the insulation 160 in embodiments like those illustrated by FIGS. 8-13. The same is true for EMI shielding 150 in embodiments like FIGS. 8-13 (i.e., any of the earlier-described EMI shielding 150 materials, application techniques, and/or curing techniques (if necessary) can be used again for the EMI shielding 150 in embodiments like FIGS. 8-13).

Figure 14:
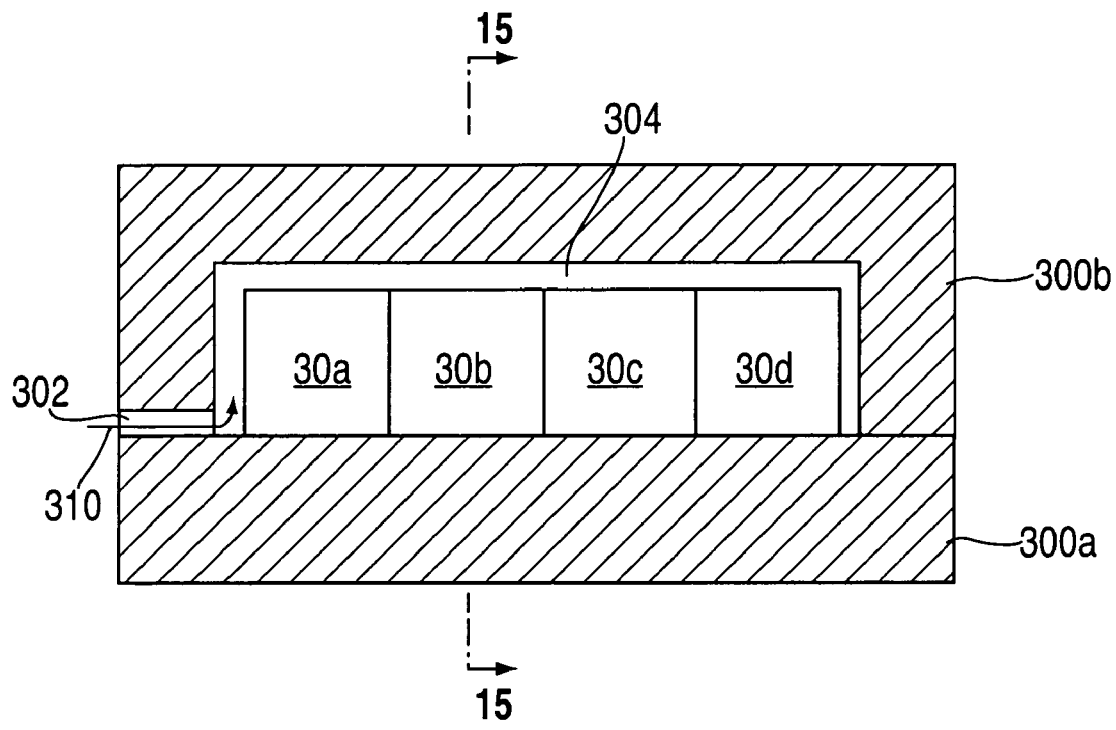
FIG. 14 is a simplified elevational view, partly in section, of an illustrative embodiment of apparatus inside processing apparatus in accordance with the invention.
Figure 15:
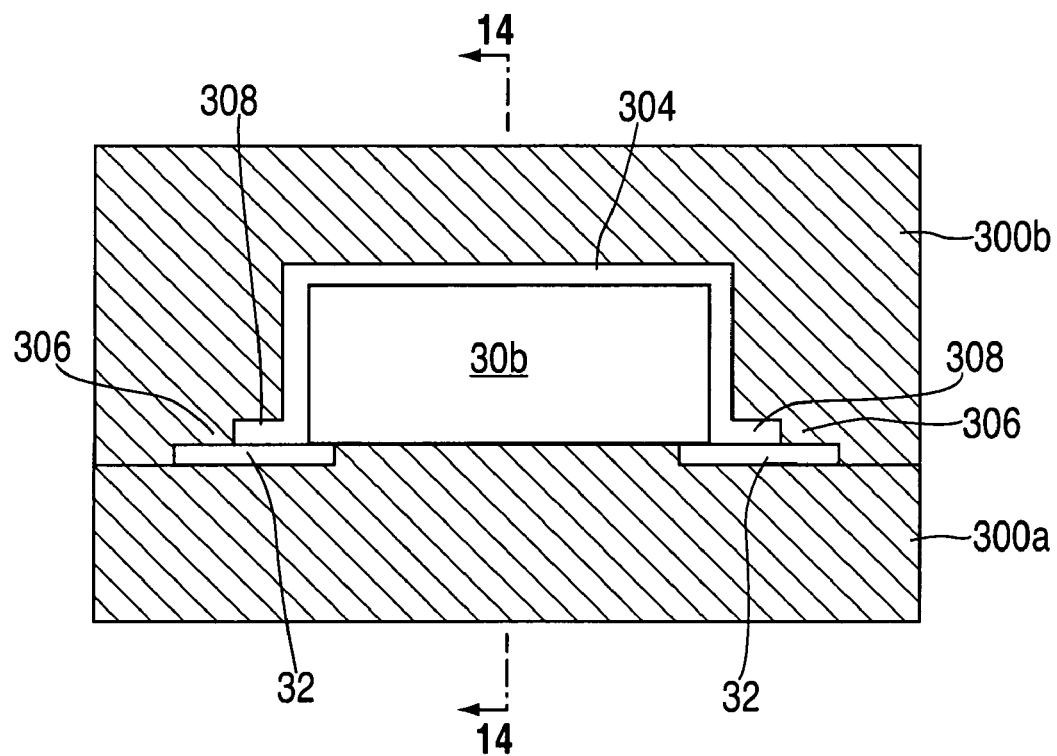
FIG. 15 is a simplified sectional view taken along the line 15-15 in FIG. 14. (Sectional portions of FIG. 14 are taken along the line 14-14 in FIG. 15.)

Alternative techniques for applying conforming insulation 160 and/or conforming EMI shielding 150 are illustrated by FIG. 14 and several subsequent FIGS. These alternative techniques involve molding insulation 160 and/or shielding 150 around the structure(s) to be insulated and/or shielded. FIGS. 14 and 15 begin the illustration of these techniques by showing an example of molding insulation 160 for a structure otherwise similar to what is shown in FIGS. 8 and 9. Thus in FIGS. 14 and 15 elements 30a-d and 32 are repeated from FIGS. 8 and 9.

FIGS. 14 and 15 show elements 30/32 placed inside a two-part mold structure 300a-b, which may be part of an injection molding machine. In particular, elements 30a-d and 32 rest on lower mold part 300a, which contacts and covers the undersides of those elements. Upper mold part 300b is then placed over elements 30a-b, 32, and 300a. Upper mold part 300b peripherally sealingly contacts lower mold part 300a, except where one or more openings like 302 may be left for injection of insulation 160 into the mold and/or for venting gas from the mold cavity. Upper mold part 300b leaves a space (cavity) 304 between its inner surface and all surfaces of assembly 30/32 that are to be coated with insulation 160. Note that upper mold part 300b does not leave such space around the outer-most end portions of leads 32. Thus in areas like 306, upper mold part 300b fits closely around the outer end portions of leads 32. However, space 304 does extend to around the inner portions of leads 32 as shown, for example, at 308.

When elements 30/32 are positioned in mold 300a-b as shown in FIGS. 14 and 15, insulation material 160 in a flowable fluid condition is injected (under pressure) into the space 304/308 around those elements as indicated by the arrow 310 in FIG. 14. This causes insulation 160 to completely fill space 304/308 and conform to (and preferably also adhere to) all surfaces of elements 30/32 that were previously exposed to space 304/308.

After insulation 160 has cured sufficiently (assuming that such curing is required), mold 300a-b can be opened (by separating parts 300a and 300b from one another), and subassembly 30/32/160 can be removed. Conforming EMI shielding 150 can now be added to this subassembly using any of the techniques described earlier, or alternatively using a further molding step as illustrated by FIG. 16, as will now be described.

Figure 16:
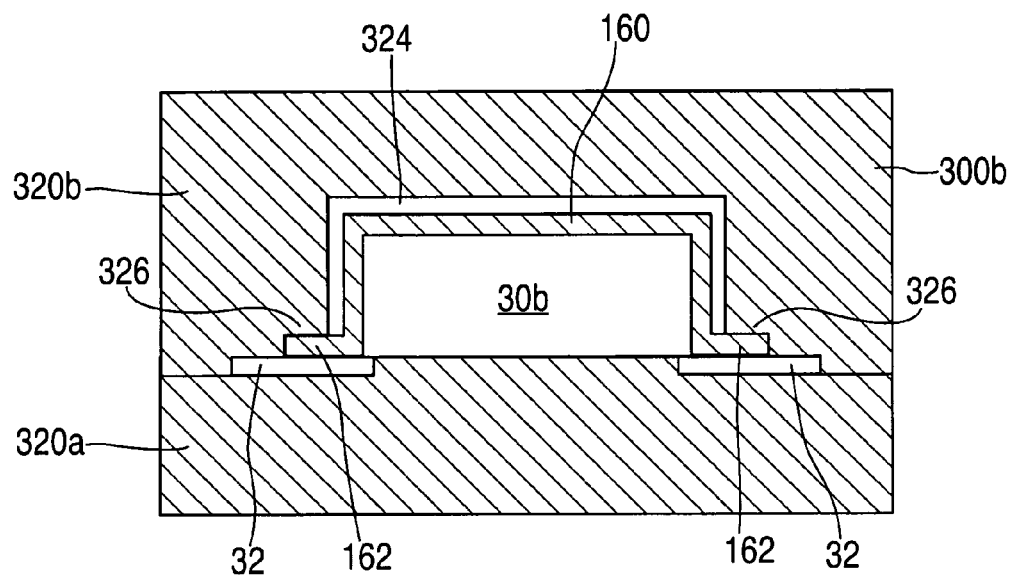
FIG. 16 is similar to FIG. 15 for later stage apparatus inside later stage processing apparatus in accordance with the invention.

As shown in FIG. 16, the subassembly of elements 30/32/160 that comes out of molding process 300a-b is placed in two-part mold 320a-b, which can be part of another injection molding machine. In particular, subassembly 30/32/160 is placed on lower mold part 320a, which again is shaped to cover the undersides of elements 30 and 32. Upper mold part 320b fits down over subassembly 30/32/160 and seals to lower mold part 320a all around subassembly 30/32/160, except for where apertures may be left for such purposes as injecting EMI shielding material 150 into the mold or allowing venting from the mold. The inner surface of upper mold part 320b leaves a space (cavity) 324 between that surface and any part of subassembly 30/32/160 that it is desired to cover with shielding 150. The inner surface of upper mold part 320b may also leave a similar space between that surface and lower part 320a where it is desired for shielding 150 to also form projections 152 for connection to ground contacts on another structure like PCB 20.

Note that upper mold part 320b is shaped (e.g., at 326) to fit snugly around outer portions of the insulation 162 that covers the inner portions of leads 32. This keeps the shielding material 150 that is injected into cavity 324 from making contact with any of leads 32.

When subassembly 30/32/160 is in mold 320a-b as shown in FIG. 16, EMI shielding material 150 in a flowable fluid state is injected (under pressure) into the space 324 that is left in the mold around selected parts of subassembly 30/32/160 as shown in FIG. 16 and described above. This causes shielding material 150 to fill space 324, whereby it conforms to (and preferably also adheres to) the portions of subassembly 30/32/160 that it is desired to shield. After shielding material 150 has cured sufficiently (assuming that such curing is necessary), the two parts of mold 320a-b can be separated, and finished assembly 30/32/160/150 can be removed. It will be appreciated that this assembly can look very much like assembly 200 in FIGS. 8 and 9, and that it can be used in the same way that assembly 200 can be used.

The molding alternatives illustrated by FIGS. 14-16 can be used for either insulation 160, or for shielding 150, or for both insulation 160 and shielding 150. Molding may allow (or at least facilitate) the use of different materials for insulation 160 and/or shielding 150 than would otherwise be possible (or at least easy) to use. For example, molding may allow the use of molten metal (e.g., molten silver) for shielding 150. As another example, molding may allow the use of certain plastics or rubbers for insulation 160 that it would otherwise be difficult or impossible to use. Molding may allow (or at least facilitate) more precise control of where insulation 160 and/or shielding 150 is deposited on underlying structures. For example, precise shaping of the insulation 162 around certain portions of leads 32 may be facilitated by molding insulation 160. Similarly, ensuring that shielding 150 does not extend beyond the outer ends of insulation portions 162 may be facilitated by molding shielding 150. Molding may also help to ensure that the molded layer or layers 160 and/or 150 have the desired thickness at all locations on the underlying structure(s). Molding does not alter the fact that the molded layer or layers 160 and/or 150 are "conforming" as that term is defined above.

Figure 17:
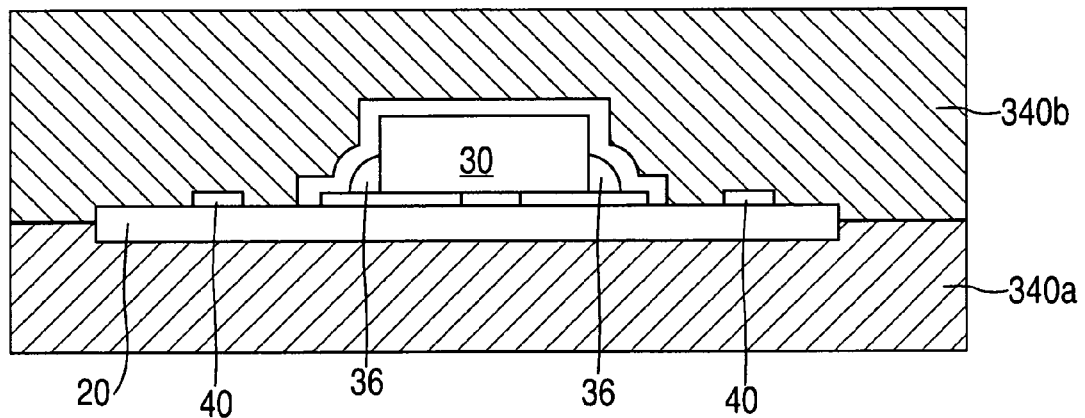
FIG. 17 is generally similar to FIG. 15, but for other illustrative apparatus and processing apparatus in accordance with the invention.
Figure 18:
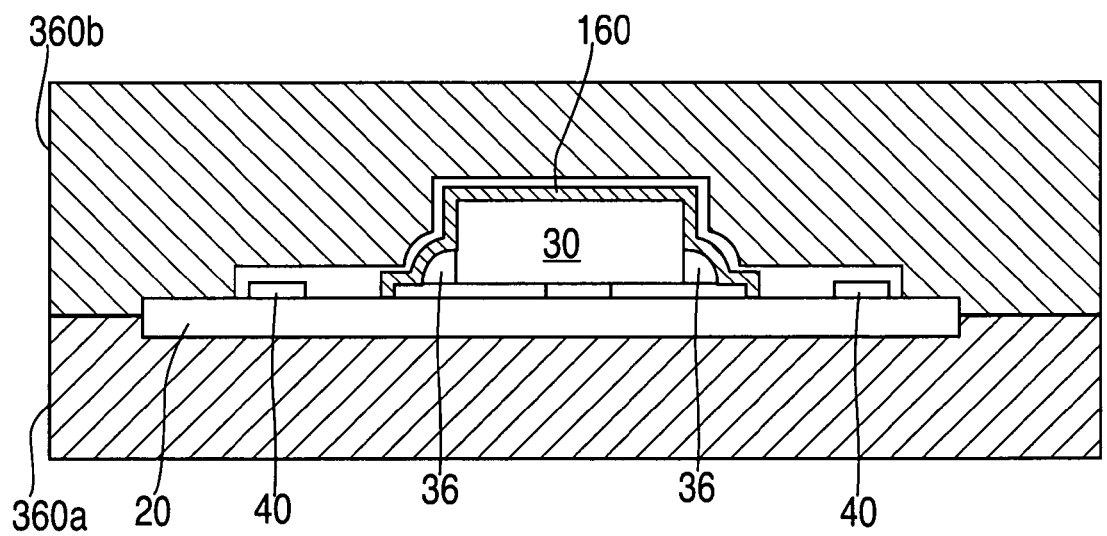
FIG. 18 is generally similar to FIG. 16, but for later stage apparatus and processing apparatus that may follow what is shown in FIG. 17 in accordance with the invention.

FIG. 17 illustrates the point that molding techniques like those described above can also be applied to circuit components that have already been mounted on a substructure such as a PCB. FIG. 17 therefore shows a subassembly like that shown in FIG. 7 (but without insulation 160 or shielding 150). This subassembly is placed in a two-part mold 340a-b that is shaped for application of insulating material 160 to desired parts of the subassembly. The resulting further subassembly (now with insulation 160) can then be placed in further molding apparatus 360a-b as shown in FIG. 18 for application of shielding material 150 to that further subassembly. The resulting final assembly will be similar to what is shown in FIG. 7, except that layers 150 and 160 will have been applied by molding rather than by other means.

Briefly recapitulating and in some respects extending some of the foregoing, electronic components on printed circuit boards may produce electromagnetic interference ("EMI") that can affect the performance of nearby electronic systems. This "noise" can affect not just products outside the mechanical envelope, but systems inside the product as well. To assist in blocking the noise emitted by a component, such components are often covered by a thin-walled metal can. This can is then soldered to the printed circuit board and connected to ground planes within the board.

The above-mentioned cans can be large and bulky compared to the components they cover. These cans can also require insulation layers and large flat areas to which to attach. What is needed is a method for producing smaller EMI-blocking features to allow space inside an enclosure to be better utilized. The present invention addresses such a need.

For example, a circuit board that has completed SMT (wherein electronic components are soldered to the board) can be placed in a custom mold (e.g., 340a-b) into which insulating potting material 160 or the like is injected to produce a thin covering of electrical insulation over the board and the components to be shielded. Once cooled or otherwise cured (if necessary), the board is removed from this first mold and placed in a second mold (e.g., 360a-b) into which silver or other appropriate metal or material is injected to produce a thin, electrically conducting coating over the potting or other insulating material. In a final (optional) stage, the part may be painted with a spray coating.

If desired, the final stage mentioned immediately above may be omitted and the metal or other EMI shielding layer may be molded with additional mechanical features for such purposes as to provide rigidity, electrical contact, heat transfer, etc. As another possible alternative, the immediately above-mentioned final stage can use a third mold to inject plastic over the EMI shielding. This plastic can have additional features molded in to serve other mechanical needs.

It will be understood that the foregoing is only illustrative of the principles of the invention, and that various modifications can be made by those skilled in the art without departing from the scope and spirit of the invention. For example, the number, shapes, sizes, etc., of the components 30 to which the invention is applied can be different from what is shown in the drawings herein, which are intended to be only generally illustrative of what can be done.

The invention claimed is:

1. Electronic circuit apparatus comprising:
   an electronic circuit component;
   a layer of electrical insulation applied to at least part of a surface of the component and a solder area so that the electrical insulation covers, conforms to, follows, contacts, and adheres to said at least part of the surface of the component; and
   a layer of electro-magnetic shielding applied to at least part of a surface of the electrical insulation so that the electro-magnetic shielding covers, conforms to, follows, contacts, and adheres to said at least part of the surface of the electrical insulation,
   wherein the layer of electro-magnetic shielding is electrically conductive, and wherein a portion of the electromagnetic shielding extends to a ground contact of a printed circuit board on which the electronic circuit component is mounted.

2. The apparatus defined in claim 1 wherein a portion of the electrical insulation extends to the printed circuit board.

3. The apparatus defined in claim 1 wherein a subassembly of the electronic circuit component, the layer of electrical insulation, and the layer of electromagnetic shielding is adapted for application to the printed circuit board.

4. The apparatus defined in claim 2 wherein the ground contact is uncovered by the electrical insulation.

5. The apparatus defined in claim 3 wherein the electromagnetic shielding is formed with a projection for reaching the ground contact when the subassembly is applied to the printed circuit board.

* * * * *

UNITED STATES PATENT AND TRADEMARK OFFICE
CERTIFICATE OF CORRECTION

| | | |
|---|---|---|
| PATENT NO. | : 7,633,015 B2 | Page 1 of 1 |
| APPLICATION NO. | : 12/214682 | |
| DATED | : December 15, 2009 | |
| INVENTOR(S) | : Josh Wurzel et al. | |

It is certified that error appears in the above-identified patent and that said Letters Patent is hereby corrected as shown below:

In column 7, line 56, delete "electromagnetic" and insert -- electro-magnetic --, therefor.

In column 8, line 48-49, in Claim 1, delete "electromagnetic" and insert -- electro-magnetic --, therefor.

In column 8, line 56, in Claim 3, delete "electromagnetic" and insert -- electro-magnetic --, therefor.

Signed and Sealed this
Fourth Day of October, 2011

David J. Kappos
*Director of the United States Patent and Trademark Office*